United States Patent
Kaiser et al.

(10) Patent No.: US 6,452,966 B1
(45) Date of Patent: Sep. 17, 2002

(54) DIGITAL SIGNAL CARRIER DETECTOR

(75) Inventors: Jeffrey Kaiser, Roselle, IL (US); Daniel Ziemba, Carpentersville, IL (US)

(73) Assignee: Charles Industries, Ltd., Rolling Meadows, IL (US)

( * ) Notice: Subject to any disclaimer, the term of this patent is extended or adjusted under 35 U.S.C. 154(b) by 0 days.

(21) Appl. No.: 09/487,072

(22) Filed: Jan. 19, 2000

(51) Int. Cl.[7] .............................................. H04B 17/00
(52) U.S. Cl. ................... 375/228; 379/24; 379/100.05; 324/76.11; 370/252
(58) Field of Search ................................ 375/228, 224, 375/316, 340; 379/24, 100.05; 324/76.11; 370/252

(56) References Cited

U.S. PATENT DOCUMENTS

| | | | |
|---|---|---|---|
| 3,614,324 A | * 10/1971 | Buzzard | 375/222 |
| 4,127,816 A | * 11/1978 | Grosso et al. | 370/216 |
| 4,578,533 A | * 3/1986 | Pierce | 370/296 |
| 4,916,694 A | * 4/1990 | Roth | 359/136 |
| 4,953,181 A | * 8/1990 | Keiper, Jr. | 375/226 |
| 5,140,614 A | 8/1992 | Buzbee et al. | |
| 5,297,167 A | 3/1994 | Buzbee et al. | |
| 5,555,276 A | * 9/1996 | Koenck et al. | 332/100 |
| 5,703,481 A | * 12/1997 | Wissman | 324/126 |
| 5,703,928 A | * 12/1997 | Galloway et al. | 324/515 |
| 5,815,534 A | * 9/1998 | Glass | 358/443 |
| 6,081,559 A | * 6/2000 | Leclerc et al. | 327/18 |
| 6,411,108 B1 | * 6/2002 | Douglas et al. | 324/658 |

* cited by examiner

*Primary Examiner*—Amanda T. Le
(74) *Attorney, Agent, or Firm*—Leydig, Voit & Mayer, Ltd.

(57) ABSTRACT

An improved digital signal line carrier type detector non-conductively senses and counts voltage pulses on a probed line. Further, the detector produces a human-readable display of the carrier type in use on the probed line, and can detect carriers of various frequencies without the use of multiple oscillators or probes. The detector may be housed in a hand-held portable housing, and may be powered by one or more batteries. A timer circuit is usable with the detector to prevent accidental discharge of the battery for an extended period of time.

15 Claims, 3 Drawing Sheets

DIGITAL SIGNAL CARRIER DETECTOR

TECHNICAL FIELD

This invention relates generally to telephone signal transmission systems and, more particularly, relates to analytical tools for providing non-conductive detection and identification of digital signal types on lines used for transmitting electrical signals.

BACKGROUND OF THE INVENTION

DSL (Digital Subscriber Line) technology is a relatively new technology that increases the data transmission rate of ordinary telephone lines substantially compared to common V.34 (33600 bps) or V.90 (56 Kbps) modems. DSL systems are either asymmetric or symmetric. Asymmetric systems provide different transmission rates depending on direction. Asymmetric systems are accordingly well suited for Internet access tasks and video on demand operations. Symmetric DSL provides data transmission at the same rate in both directions. DSL uses a packet switching technology that operates independently of the ordinary voice telephone system. The maximum transmission rate of a DSL system decreases as the distance between transmitting and receiving sites increases. This is predominantly due to voltage deterioration and signal spreading experienced by digital signals as a function of distance.

Often, service personnel or craftspersons wish to determine which line or lines in a given bundle of lines are carrying DSL signal. Furthermore, because conductive probing of DSL lines can damage wires, cause signal deterioration, and present a serious shock hazard due to high line voltages on some wires, non-conductive probing of such lines is desirable. Known DSL probing methods designed to meet these requirements are lacking in other respects. The devices disclosed in U.S. Pat. Nos. 5,297,167 and 5,140,614 capacitively sense voltage changes on a line, and convert the sensed voltage changes to an audible signal. The strength and frequency of the audible signal are used by the technician to surmise whether the probed line is carrying DSL signals. A relatively weak audible signal emitted by the probe may indicate the presence of electromagnetic coupling with nearby lines rather than an actual DSL signal on the probed line.

The probes of the U.S. Pat. Nos. 5,297,167 and 5,140,614 patents both utilize a heterodyning technique. This technique entails combining a capacitively detected high frequency (f1) DSL signal with a locally generated signal of a frequency (f2) that differs by an amount f3, where f3 is audible to the human ear. The resultant signal has both high frequency (f1+f2) and low frequency ($|f1-f2|=f3$) components. A low pass filter removes the high frequency component leaving an audible signal of frequency f3.

It can be seen that if the frequency of the probed signal differs from that of the local oscillator by more than the range of human hearing, which spans at most 20 kHz, then the filtered heterodyned signal will not be in the human-audible range. This has necessitated the use of multiple probes for multiple carrier types. For example, one probe is required for T1 lines, which operate at 1.544 Mb/s and another for E1 lines, which operate at 2.048 Mb/s.

A digital signal probe is needed that easily, accurately, and non-conductively detects digital signals.

SUMMARY OF THE INVENTION

The present invention remedies a number of the shortcomings in prior known hand-held detectors. In accordance with the present invention, a detector containing signal detection and processing circuitry counts at least a portion of the signal transitions on a probed line. The detector further contains threshold circuitry that reduces signal identification errors resulting from weak electromagnetic coupling, or "cross-talk." Because the detector operates by counting transitions rather than heterodyning, there is no similar limitation on the identifiable frequency ranges. For example, a single detector according to the present invention preferably detects different carrier types even when they differ greatly in frequency, such as T1 and E1 carrier types.

Additionally, a detector according to the invention may further comprise a human-readable display usable to display an indication of the counted frequency of the probed line. Such indication may be of the carrier type, capacity, or frequency, or other quantifiable indication related to a detected count.

Additional features and advantages of the invention will be made apparent from the following detailed description of illustrative embodiments which proceeds with reference to the accompanying figures.

BRIEF DESCRIPTION OF THE DRAWINGS

While the appended claims set forth the features of the present invention with particularity, the invention, together with its objects and advantages, may be best understood from the following detailed description taken in conjunction with the accompanying drawings of which:

DETAILED DESCRIPTION OF THE INVENTION

Figure 1:
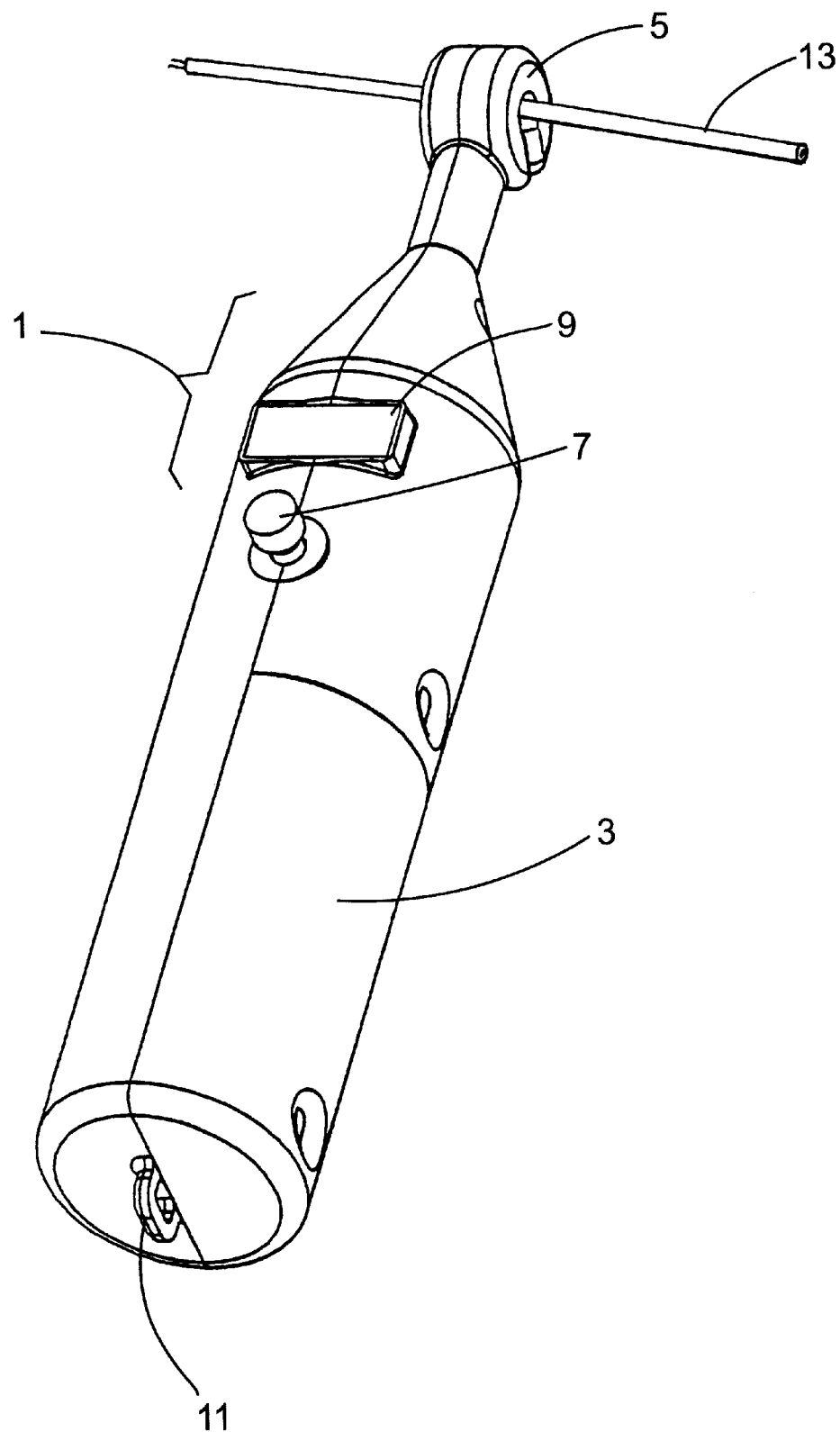
FIG. 1 is a perspective external view of a detector according to an embodiment of the invention.

Turning to FIG. 1, in an embodiment of the invention, certain elements are housed in a hand-held ergonomic housing 1, having handle 3 and probe 5 portions. The handle 3 is dimensioned so as to provide a grip for a human hand, and may have a depressible switch 7 for operation located thereon in an accessible manner. In order to facilitate non-conductive (i.e., no current is drawn) probing of a digital line 13, the probe portion 5 is shaped as an open torroidal circular curve, or polygon so that it can be situated in a substantially surrounding relationship to the line 13, as will be more fully described hereinafter. For capacitive rather than inductive sensing, the probe portion could be shaped as two opposing plates to be situated between line pairs. However, inductive sensing is preferred, because it detects predominantly what is within the inductive element, while a capacitive probe requires a line pair for sufficient signal, and may be excessively influenced by nearby lines which are not being probed.

In a preferred embodiment of the invention, the handle 3 supports a display 9 for visually conveying to the craftsperson an indication of the type of signal detected in the form of a name, symbol, and/or frequency, as well as any other messages for operation. Other messages include low battery warnings, error codes, and so on. Additionally or alternatively. the housing 1 includes an attachment point 11 such as a loop for attachment to a lanyard, cord, or strap.

Figure 3:
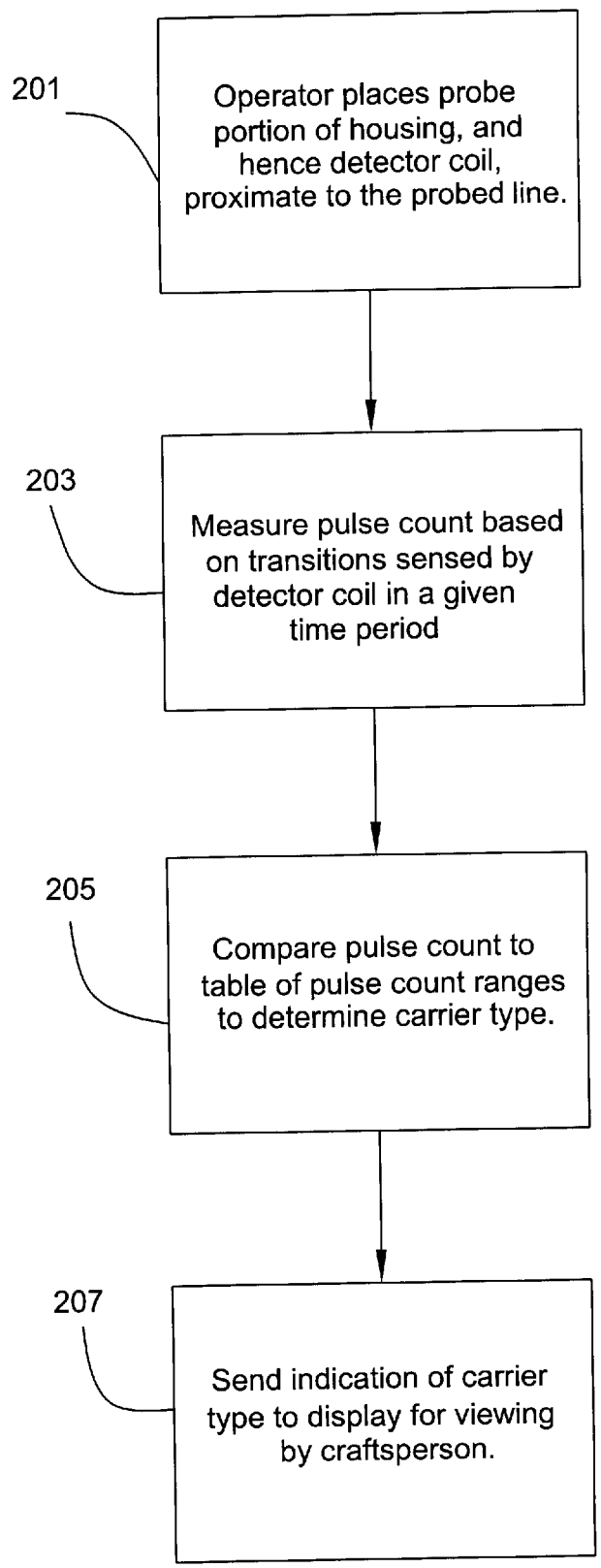
FIG. 3 is a flow chart summarizing the steps followed to identify an unknown carrier signal in an embodiment of the invention.

In operation the craftsperson situates the housing 1 such that probe portion 5 partially encompasses the line 13 to be probed, as set forth in step 201 of the flow chart of FIG. 3. During step 203, when the unit is activated via switch 7 or otherwise, the unit detects at least a portion of logical transitions (e.g. positive transitions, negative transitions, etc.) in a signal stream on line 13 during a period to establish a detected pulse count of the detected signal stream. Next, at step 205, the unit correlates the detected pulse count with a set of pulse count ranges representative of and corresponding to expected count value ranges for various digital signal transmission conventions. Lastly, during step 207 the detector displays to the craftsperson via display 9 an alphanumeric code corresponding to the type of digital signal detected. If the count derived in step 203 does not correlate in step 205 with a pulse count range in the set, the display in step 207 may consist simply of the count value, or of an error signal such as a question mark.

Figure 2:
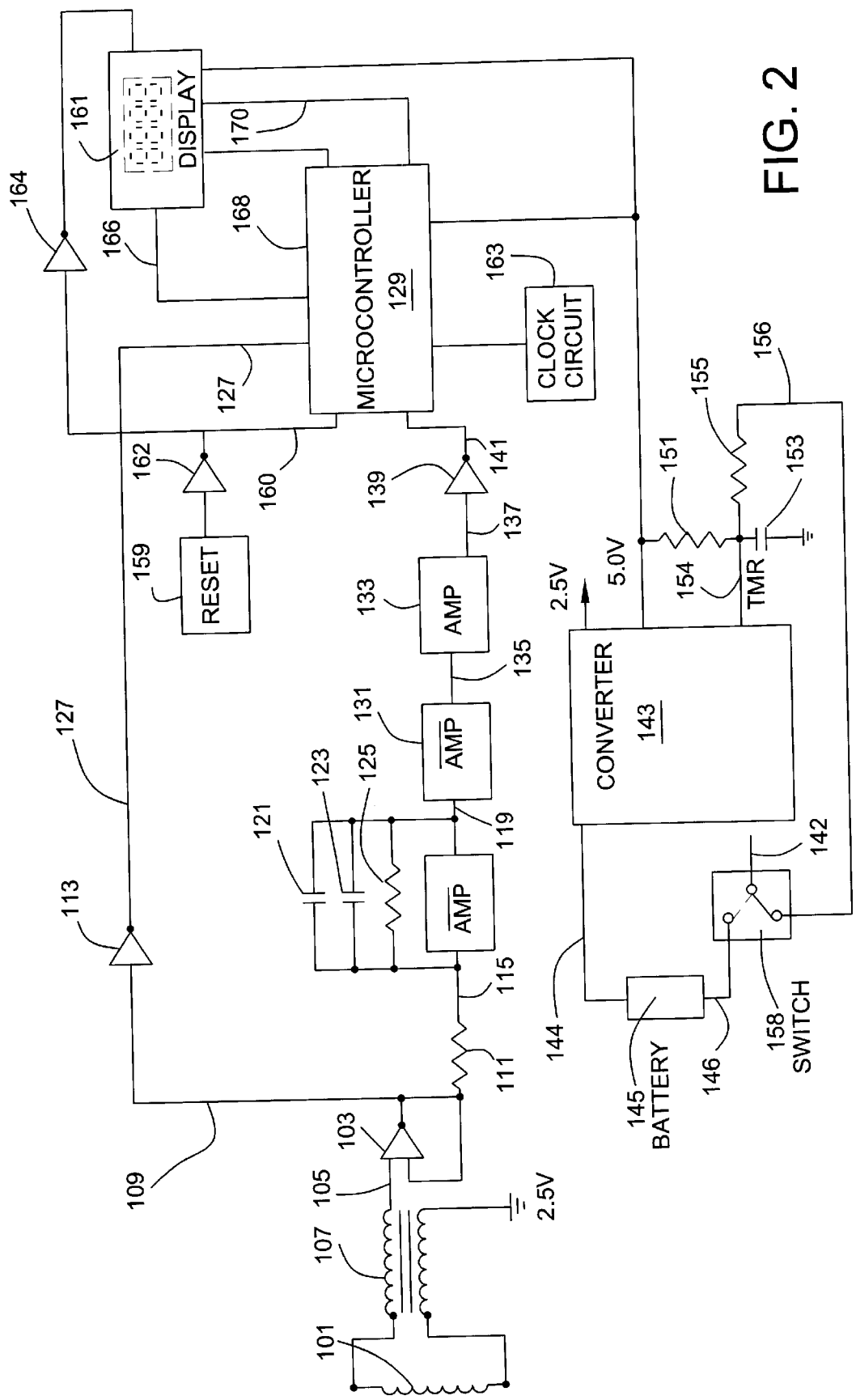
FIG. 2 is a schematic drawing of circuitry usable in an embodiment of the invention.

FIG. 2 illustrates in greater detail circuitry usable in an embodiment of the invention to accomplish detection and notification functions. Detector coil 101 located within the probe portion 5 of the housing 1 is arranged to inductively sense proximate fluctuating magnetic fields such as those generated by line 13 while carrying a high frequency digital signal. Common mode choke 107, coupled to detector coil 101, filters high frequency noise generated by electronic circuitry of the hand-held detector that could effect the line 13 under sense. A voltage follower 103, coupled to the common mode choke 107 via line 105, amplifies the current received on line 105 from the common mode choke 107. Voltage follower 103 is preferably a unitary gain amplifier.

In operation, the current output from voltage follower 103 varies proportionally with the current supplied by coil 101. The voltage follower 103 receives and conveys the voltage from line 105, increasing the current to the received signal to sustain more current drain. The voltage follower 103 is constructed from an op-amp such as those supplied in the LM324A low power quad operational amplifier IC produced by SGS-Thomson Microelectronics by connecting the op-amp output to the negative op-amp input. This will cause the op-amp output voltage to be substantially identical to the input voltage at the positive input of the op-amp.

The output of follower 103 is connected via line 109 to resistor 111 and inverter 113. Resistor 111 is a 10 kOhm or similar resistor. The output of resistor 111 is connected to line 115, which is in turn connected to the negative input of op-amp 117. The positive input of op-amp 117 is tied to ground, with the output connected to line 119. Capacitors 121, 123 of 22 pF capacitance and a resistor 125 of 49.9 kOhm are connected in parallel between lines 115 and 119. The output of op-amp 117 connected as described is an inverted, amplified, and low-pass filtered signal corresponding to the output of follower 103. The low pass filtering is desirable if there are stray high frequency signals on the probed line, caused perhaps by electromagnetic coupling with nearby lines.

Inverting amplifier 131 receives the output of op-amp 117 on line 119, producing an inverted amplified signal on line 135. Amplifier 133 receives the output of inverting amplifier 131 via line 135 and supplies an amplified output via line 137 to Schmitt trigger 139. Schmitt trigger 139 supplies an inverted digital output to a data input of microcontroller 129 via line 141.

Staging amplification as described above is preferred, but not required to practice the present invention. In an alternative embodiment a single stage amplifier is used. However staging amplification provides certain benefits given current electrical component technology. For example, staging lower gain amplifiers (instead of using a single high gain amplifier) achieves desired high gain, while avoiding frequency response reduction that typically results from using a single higher gain amplifier.

Inverter 113 supplies an output on high power bypass line 127 to a second data input of microcontroller 129. Thus if the unamplified output of voltage follower 103 is sufficient for the microcontroller 129 to register digital transitions, the microcontroller 129 is able to receive and correctly interpret the signal inverted directly from that point without further amplification or filtering. In turn, microcontroller 129 preferably ignores signals received via line 141 during the same time period because the amplifiers are likely saturated and unable to accurately transmit the received signal stream. The microcontroller 129 is, by way of example, an Atmel AT89C52 or AT89C55, with the 0, 1, and 2 counters assigned to record time, count on line 141, and count on line 127 respectively. An oscillator such as crystal oscillator 163 is preferably utilized to provide the clock signal to the microcontroller 129, and to counter 0. Counters 1 and 2 are triggered by a high-to-low transition, so that the falling edge of each detected pulse is preferably counted by the microcontroller 129.

In practice selection of the proper line for purposes of counting transitions is accomplished by assigning separate counters within microcontroller 129 to each one of the two distinct data input lines. A first counter within microcontroller 129 counts pulses received via line 141, and a second counter counts pulses received via line 127. The higher count value is used in further processing, and the lower count value is ignored.

Take for example a high power signal such as an ADSL signal. Such a signal will likely saturate one or more amplifiers leading to line 141, causing the count from that line to be lower (due to missed high-to-low signal transitions) than it would otherwise be if the amplifier(s) did not saturate. The same, high power, ADSL signal does not saturate the inverter 113 on the high power bypass line. Line 127 thus provides the more accurate count signal for the relatively high power ADSL signal. The higher count established by the counter assigned to the signal received on line 127 is used for further processing.

The described circuitry is powered by any convenient electrical power source. The illustrated circuit preferably operates on a supply voltage of 5V, and may accordingly be powered by a DC-to-DC converter 143 (including a MAXIM MAX1705 circuit) connected via lines 142 and 144 to a 1.5V battery 145, such as a standard "C-cell" or "D-cell." In an embodiment of the invention, the power circuitry includes a timer (and discharge) circuit such as a pull-up resistor 151 connected to the supply voltage (5 volts) and (via line 154) to capacitor 153 in series. The pull-up resistor 151 and capacitor 153 have values chosen to give a desired delay before the converter 143 is disabled. Line 154 is connected to an "on control" input for the converter 143 such that a high voltage at that input disables the converter 143, shutting off the converter 143 when the capacitor 153 has received a sufficient charge through resister 151.

The illustrated timer circuit also includes a discharge resistor 155 that is also connected to line 154 between the pull-up resistor 151 and capacitor 153. The other terminal of the discharge resistor 155 is connected to line 156. Line 156 terminates at the "off" terminal of switch 158. Line 142 connects switch 158 to the low voltage input of converter 143. Switch 158 selectively connects line 142 to the negative battery terminal via line 146 (when the spring loaded button is depressed), and to line 156 (when the button is released).

In operation, a craftsperson manipulates the switch 158 (for example by depressing the spring loaded button) to disconnect the discharge line 156 and connect to line 146 enabling the battery 145 to supply power to the converter 143. In turn the converter 143 powers the entire circuit described to this point by supplying 5 volts to the microcontroller 129, display 161, and the high voltage inputs to the amplifiers and buffers. The converter 143 supplies precision 2.5 volts to the reference inputs to the detector coil 101 and amplifiers 117, 131 and 135.

With the supply voltage at high voltage, the voltage on line 154 becomes high in an amount of time determined by the values of resistor 151 and capacitor 153, disabling the converter 143 and preventing further drain on the battery 145 after that amount of time. This avoids draining of the battery by inadvertent continuous activation of the switch 158. Release of the spring loaded button causes the switch 158 to disconnect power to converter 143 and to connect discharge resistor 155 through line 156 to the ground input of the converter 143 thereby draining the accumulated charge on capacitor 153.

Preferably, a power on reset circuit 159 is provided to reset microcontroller 129 and blank the display 161 when the switch 158 is initially toggled to the activated state. The power on reset signal is transmitted through inverters 162 and 164 to the blanking input of the display 161. The power on reset signal is also transmitted through inverter 162 to line 160 which connects to a "reset" input on the microcontroller 129. After the microcontroller 129 executes a start-up sequence it clears the display with a clear signal transmitted on line 166 which resets all the values stored in the display 161. Thereafter, data lines 168 and address lines 170 reload the registers of the display 161.

While the circuitry is powered, it is operable to count and display the carrier frequency on a probed line as will now be described in more detail. Each pulse detected by detector 101 appears as a voltage pulse of relatively large or small magnitude on line 109 as described above. If the signal is large enough to cross a voltage threshold of the controller 129 data inputs, it is counted as a transition by microcontroller 129 upon receipt of the inverted signal via line 127. For very large and very small detected signals, the counts on the counters assigned to lines 127 and 141 will differ. For very large signals, the staged amplifiers leading up to line 141 will saturate causing a low count on line 127. However, if the detected signal on line 109 is very small, but is large enough to trigger Schmitt trigger 139 once amplified by amplifiers 117, 131, and 133, then a transition is counted by microcontroller 129 as received via line 141, but not at the counter assigned to line 127.

Controller 129 is programmed in a manner familiar to one of skill in the art to count the number of transitions received in a given period of time. For example, the controller may count the number of transitions occurring in a ¼ second sample period, as the transitions are received via lines 127 or 141. A table is then used to correlate the quarter-second transition count with a carrier type.

It is desirable that the table correlate carrier types to a range of count values, rather than to a specific count value, since the detected carrier transitions count varies with carrier signal strength. The signal strength varies as a function of the distance between the probed point and the transmitter. In particular, the carrier signal strength decreases the further the probed point is from the originating signal source. Thus, a single carrier type may yield a different detected frequency depending upon where along the transmission path the line is probed. On a signal line carrying information in both directions, each signal stream will be strongest, and hence most detectable, at its transmitter, and weakest, and hence least detectable at its receiver. At the midpoint of the line, both signals may be detectable. Accordingly, it has been determined that a given carrier may exhibit a detected count rate at the midpoint which is approximately double the detected count rate at either end.

At the end of every sample period after having determined the type of signal detected, the microcontroller 129 writes an indication of the signal type to a human-readable display 161. Display 161 may be any type of visual display and the indication of signal type may be either an indication of the magnitude of the count, the frequency itself, or of the type of signal calculated by the controller. Display 161 is preferably, but not necessarily, an intelligent display such as the Siemens SLG2016 Alphanumeric Intelligent Display. In an embodiment, the microcontroller 129 alternatingly writes frequency-equivalent carrier types to the display 161. Thus, instead of simply displaying "T1", the display could intermittently also display for example "PRIS" for Primary Rate ISDN, which operates at the same frequency as T1, and so on.

Any carrier type can be sensed and displayed in the same manner. For example, carriers such as 56 Kb/s, 64 Kb/s, DDL, HDSL, 2B+D and Basic Rate ISDN are detected via the same method, their transitions counted and correlated to a carrier type, and a visual indication given of that type or of the count related to that type as discussed above. Table 1 gives a non-exhaustive list of carrier types and their empirically determined range of operation in counts per quarter second.

TABLE 1

| CARRIER TYPE | COUNTS/SEC/4 |
| --- | --- |
| DDL, ISDN | 5,500–7,250 |
| DMLQ | 8,250–11,250 |
| MDDL, HDSL | 23,750–35,000 |
| ADSL | 38,000–60,500 |
| T1 | 94,000–98,000 |
| E1 | 125,000–131,000 |
| 56K | 3,300–3,750 |
| 64K | 4,000–4,500 |

Preferably, the microcontroller 129 is also programmed to supply a signal to the display 161 when signal type is unknown. Thus, for example, the microcontroller 129 may write to the display 161 a signal such as "?" when a signal is unknown or is not a digital signal at all. Alternatively, the display may simply show a pulse count or frequency in such cases. Additionally, the controller also preferably supplies a signal to display 161 to indicate to the craftsperson an actual or imminent low battery condition. Such a signal could be "batt" written to the display intermittently between indications of signal type. Such a low battery signal may be the result of receipt by the microcontroller 129 of a low battery indication signal from a power chip such as those made by Maxim which may house the DC-to-DC converter 143 as well.

In an alternative embodiment, the visual indicator of carrier type consists of an array of LED's or lights located proximally to a listing of carrier types. In this embodiment, the microcontroller 129 causes the LED or light nearest to the list item corresponding to the detected carrier type to light. Thus, the list may include "T1", "E1", and so on, and when a T1 carrier is detected, the LED or light nearest "T1" would light.

In view of the many possible embodiments to which the principles of this invention may be applied, it should be recognized that the embodiments described herein with respect to the drawing figures are meant to be illustrative only and should not be taken as limiting the scope of invention. For example, those of skill in the art will recognize that the shape or external appearance of the probe are not critical as long as a probe element is able to detect signals present on the probed line. Additionally, it will be appreciated by those of skill in the art that pulse detection and counting apparatuses and methods not utilizing a microcontroller may equivalently be used to count detected pulses. Accordingly, the invention is not limited to the illustrated embodiment. Rather, the invention as described herein contemplates all such embodiments as may come within the scope of the following claims and equivalents thereof.

We claim:

1. A detector for non-conductively determining the carrier type of a digital signal stream conveyed via a probed transmission line, the detector comprising:
   a probe element to non-conductively produce a pulse stream signal indicative of digital signal pulses in the digital signal stream conveyed on the probed transmission line;
   a counter responsive to the pulse stream signal to count the number of voltage pulses in the pulse stream signal in a period of time;
   a signal type determiner for producing a carrier type signal based at least in part upon a value provided by the counter; and
   a display logically coupled to the counter responsive to the carrier type signal to display a visual indication of the carrier type corresponding to the carrier type signal.

2. The detector according to claim 1, further comprising a power source and a power off timer connected to the power source, wherein the power off timer causes the power source to be disabled after a predetermined amount of time.

3. The detector according to claim 2, wherein the power source comprises a battery.

4. The detector according to claim 1, wherein the display comprises an alphanumeric light emitting diode array.

5. The detector according to claim 4, wherein the visual indication of carrier type comprises a textual indication of the name of the carrier type.

6. The detector according to claim 5, further comprising a voltage detector having an output supplying a low battery indication, wherein the display exhibits a textual indication that the battery is low responsive to the low battery indication.

7. The detector according to claim 4, wherein the visual indication of carrier type comprises a numerical indication of the number of voltage pulses in the transition signal in the period of time.

8. The detector according to claim 4, wherein the visual indication of carrier type comprises a numerical indication related to a pulse frequency of the carrier signal.

9. The detector according to claim 1, wherein the display comprises a light source located proximally to a textual carrier type indication.

10. A method for determining the carrier type of a digital signal stream being conveyed via a probed transmission line, comprising the steps of:
    non-conductively sensing voltage pulses in the digital signal stream;
    counting the number of sensed voltage pulses occurring in a predetermined amount of time;
    correlating the counted number of sensed voltage pulses in the predetermined amount of time with a carrier type; and
    displaying on a human-readable display a representation of a carrier type rendered in accordance with the correlating step.

11. The method according to claim 10, wherein the step of non-conductively sensing voltage pulses in the digital signal stream further comprises the steps of:
    placing an inductive coil proximately to the probed transmission line to produce a sensed current through the coil; and
    receiving the sensed current and producing therefrom a corresponding voltage signal substantially proportional to the sensed current.

12. The method according to claim 11, wherein the step of counting the number of sensed voltage pulses occurring in a predetermined amount of time comprises the steps of:
    amplifying the corresponding voltage signal;
    processing the amplified corresponding voltage signal to produce a digital signal; and
    counting the number of sensed voltage pulses occurring in a predetermined amount of time in the digital signal.

13. The method according to claim 12, wherein the step of processing the amplified signal to produce a digital signal further comprises the steps of:
    inputting the amplified signal to a Schmidt trigger; and
    receiving a digital signal from an output of the Schmidt trigger.

14. The method according to claim 12, wherein the step of correlating the counted number of sensed voltage pulses with a carrier type further comprises the steps of:
    comparing the counted number of sensed voltage pulses with a predetermined count range correlated with a particular carrier type; and
    determining that the carrier type corresponds to the particular carrier type if the counted number of sensed voltage pulses is within the predetermined count range.

15. The method according to claim 10, wherein the probed transmission line comprises one of a pair of transmission lines, and the step of non-conductively sensing voltage pulses in the digital signal further comprises the step of placing conductive plates of a capacitor between the pair of transmission lines to produce a sensed voltage across the capacitor.

* * * * *